US005729264A

United States Patent [19]

Pankert et al.

[11] Patent Number: 5,729,264

[45] Date of Patent: Mar. 17, 1998

[54] INK JET RECORDING DEVICE WITH PRESSURE CHAMBER HAVING AN ACTIVE DIRECTION NORMAL TO THE RECORDING HEAD ACTUATOR PLATE

[75] Inventors: Joseph R.R. Pankert, Aachen, Germany; Johannes R. Roulaux, Nieuwstadt, Netherlands

[73] Assignee: U.S. Philips Corporation, New York, N.Y.

[21] Appl. No.: 556,691

[22] Filed: Nov. 13, 1995

[30] Foreign Application Priority Data

Nov. 14, 1994 [EP] European Pat. Off. .............. 94203301

[51] Int. Cl.$^6$ .......................... B41J 21/045; H01L 41/04

[52] U.S. Cl. ................................ 347/71; 347/72; 310/328

[58] Field of Search .................................. 347/68–71, 72; 310/328, 331, 332

[56] References Cited

U.S. PATENT DOCUMENTS

| | | | |
|---|---|---|---|
| 3,946,398 | 3/1976 | Kyser et al. | 346/1 |
| 5,311,219 | 5/1994 | Ochiai et al. | 310/328 |
| 5,359,350 | 10/1994 | Nakano et al. | 347/10 |
| 5,453,767 | 9/1995 | Chang et al. | 347/10 |
| 5,475,407 | 12/1995 | Ohashi | 347/69 |

FOREIGN PATENT DOCUMENTS

| | | | |
|---|---|---|---|
| 0516188A1 | 12/1992 | European Pat. Off. | B41J 2/045 |
| 0573055A2 | 12/1993 | European Pat. Off. | B41J 2/14 |
| 3-65350 | 3/1991 | Japan | 347/68 |

*Primary Examiner*—Benjamin R. Fuller
*Assistant Examiner*—Judy Nguyen
*Attorney, Agent, or Firm*—Leroy Eason

[57] ABSTRACT

An ink jet recording device includes an ink jet recording head comprising at least one pressure chamber communicating with an ink reservoir via an ink supply channel and a nozzle plate comprising at least one nozzle opening for emitting droplets of ink, the nozzle plate forms a wall of the pressure chamber. The recording head further comprises a piezoelectric actuator element having an active direction and comprising at least one layer of piezoelectric material and at least two electrode layers which are arranged such that the dimension of the actuator element in the active direction is varied upon application of an electric voltage between terminals that are electrically connected to the electrode layers. The actuator element is arranged in cooperative relationship with the pressure chamber so that the pressure chamber changes its volume when the dimension of the actuator element in the active direction is varied. The piezoelectric actuator element is formed as an actuator plate, its active direction coinciding with the direction of the thickness of the actuator plate, and a recess is provided in the actuator plate to form the pressure chamber.

12 Claims, 5 Drawing Sheets

INK JET RECORDING DEVICE WITH PRESSURE CHAMBER HAVING AN ACTIVE DIRECTION NORMAL TO THE RECORDING HEAD ACTUATOR PLATE

BACKGROUND OF THE INVENTION

1. Field of the Invention

The invention relates to an ink jet recording device which includes a recording head comprising:

- at least one pressure chamber communicating with an ink reservoir via an ink supply channel;
- a nozzle plate having at least one nozzle opening for emitting droplets of ink, the nozzle plate forming a wall of the pressure chamber; and
- a piezoelectric actuator element having an active direction and which includes at least one layer of piezoelectric material and at least two electrode layers which are arranged such that the dimension of the actuator element in the active direction is varied upon application of an electric voltage between terminals that are electrically connected to the electrode layers. The actuator element is arranged in cooperative relationship with the pressure chamber so that the pressure chamber changes its volume when the dimension of the actuator element in the active direction is varied. The invention also relates to an ink jet recording head that is suitable for such an ink jet recording device.

2. Description of the Related Art

An ink jet recording head for a device of the type aforesaid is disclosed in EP-A-0 573 055. This ink jet recording head comprises a transducer unit base on which piezoelectric actuator elements are mounted. Each piezoelectric actuator element consists of a plurality of layers of a piezoelectric ceramic material with an electrically conductive electrode layer interposed between each pair of adjacent layers. The first, third, fifth, etc. electrode layers are all connected to a first terminal and the second, fourth, sixth, etc. electrode layers are all connected to a second terminal. When a voltage is applied between the first and second terminals, the dimension of the actuator element in an active direction is varied. A piezoelectric actuator element of this kind is known as a ceramic multilayer actuator (CMA). In the known device, the actuator elements have a rod-like shape with the electrode layers extending in the longitudinal direction of the rod which coincides with the active direction. The device further comprises a spacer in which pressure chambers, ink reservoirs and ink channels are formed. The pressure chambers are formed as through holes that extend between the opposite faces of the spacer. One of these faces is covered with a nozzle plate and the other one with a vibrating plate so that the nozzle plate and the vibrating plate form two opposite walls of the pressure chamber. One end of the rod-shaped actuator element bears against the face of the vibrator plate opposite the pressure chamber so that the volume of the pressure chamber changes when the actuator element changes its length as a result of a voltage applied between the terminals. The construction of the vibrating plate is rather complicated and precision tools are required to manufacture it. Moreover, the actuator element must be positioned opposite the pressure chamber with a high accuracy. Therefore, it is time-consuming and expensive to construct the known recording head.

SUMMARY OF THE INVENTION

It is an object of the invention to provide an ink jet recording device of the aforesaid kind but having a recording head with a simpler construction that can be manufactured relatively inexpensively. To achieve this object, a recording device in accordance with the invention is characterized in that the piezoelectric actuator element is formed as an actuator plate, its active direction coinciding with the direction of the thickness of the actuator plate, a recess being provided in the actuator plate to form the pressure chamber. Because the pressure chamber is formed as a recess in the actuator plate, the position of the actuator element relative to the pressure chamber is always correct and the complicated vibrating plate can be omitted.

A first embodiment of the recording device according to the invention is characterized in that the recess extends completely through the thickness of the actuator plate so as to connect first and second opposite faces thereof, the nozzle plate having a first face that adjoins the first face of the actuator plate so as to form a first wall of the pressure chamber, a base plate being provided that has a first face which adjoins the second face of the actuator plate so as to form a second wall of the pressure chamber. Thus, in this embodiment the pressure chamber is in the form of a through hole connecting the opposite faces of the actuator plate. Such a through hole can be easily manufactured, for example by etching, powder blasting or laser cutting either from one face of the plate or from both faces. The ink reservoir and the ink channel may be formed as recesses in either the first or the second face of the actuator plate. The ink reservoir and the ink supply channel may also be formed as recesses in the first face of the nozzle plate or the first face of the base plate.

A further embodiment of the recording device according to the invention is characterized in that the recess is provided in a first face of the actuator plate without extending through to a second face opposite the first face, the nozzle plate having a first face that adjoins the first face of the actuator plate so as to form a first wall of the pressure chamber. In this embodiment tile manufacture of the pressure chamber, for which similar methods may be employed as for the first embodiment, requires an increased precision because the pressure chamber must have a given depth not exceeding the thickness of the actuator plate. On the other hand, a base plate may be omitted and, if a base plate is used to reinforce the actuator plate, it is not necessary to ensure that a hermetic connection is obtained between the base plate and the actuator plate. In this embodiment the ink reservoir and the ink supply channel may be formed as recesses in the first face of the nozzle plate or the first face of the actuator plate.

A further embodiment of the recording device in accordance with the invention is characterized in that an intermediate plate is provided between the first face of the actuator plate and the nozzle plate, the ink reservoir and the ink supply channel being formed as apertures in the intermediate plate. The intermediate plate may be a relatively thin metal plate in which the apertures can easily be manufactured with a high precision, for example by etching, spark erosion or laser cutting. This is particularly important for the ink supply channel which must have a relatively small width because it must resist the flow of ink in order to ensure that the ink is ejected through the nozzle opening instead of flowing back to the ink reservoir when the actuator element decreases the volume of the pressure chamber.

Preferably, a substantial part of the volume of the pressure chamber is filled with a filler. This measure serves to decrease the effective volume of the pressure chamber so that the relative change in volume caused by a given variation of the width of the actuator plate is increased. The filler can be provided very easily in an embodiment wherein the filler comprises a protrusion formed on the first face of the nozzle plate or on the first face of the base plate. It is also possible for the filler to comprise a porous material (for example a quantity of glass balls, rock wool or the like) or a flexible material such as rubber.

As a consequence of the integration of the pressure chamber into the actuator plate, the electrode layers are exposed at the interior of the pressure chamber. During operation these electrode layers are pairwise at different potentials and in a case where non-insulating inks are used, such as e.g. water-based inks, contact to the electrode layers at different potential could possibly lead to detrimental electrochemical processes. An embodiment of the device according to the invention in which such problems are avoided is characterized in that a coating of an electrically insulating material is provided on the interior walls of the recess in the actuator plate that forms the pressure chamber, said coating covering at least those parts of the walls in which electrode layers are exposed to the interior of the pressure chamber.

BRIEF DESCRIPTION OF THE DRAWINGS

These and other aspects of the invention will be described in detail hereinafter with respect to the drawings, wherein.

DESCRIPTION OF THE PREFERRED EMBODIMENTS

Figure 1:
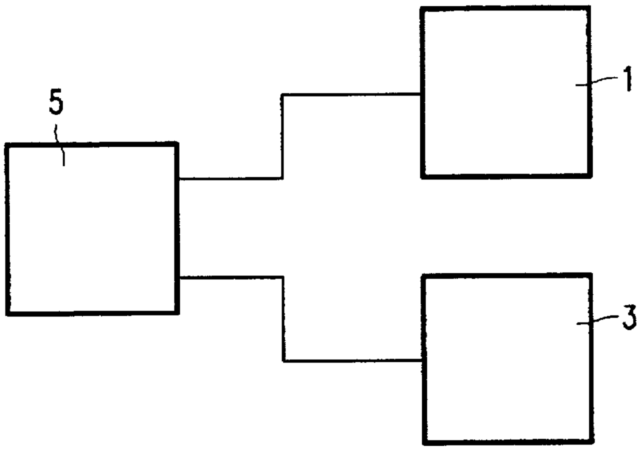
FIG. 1 is a simplified block diagram of an ink jet recording device according to the invention.

Throughout the figures the same reference numerals have been used for corresponding elements. FIG. 1 is a block diagram showing only the most essential parts of an ink jet recording device in accordance with the invention. Such a device comprises an ink jet recording head 1, a paper transport mechanism 3 and a control unit 5. The general construction of ink jet printing devices is well known in the art, see for example U.S. Pat. No. 3,946,398. The device according to the invention differs from the known devices mainly in the construction of the recording head 1.

Figure 2:
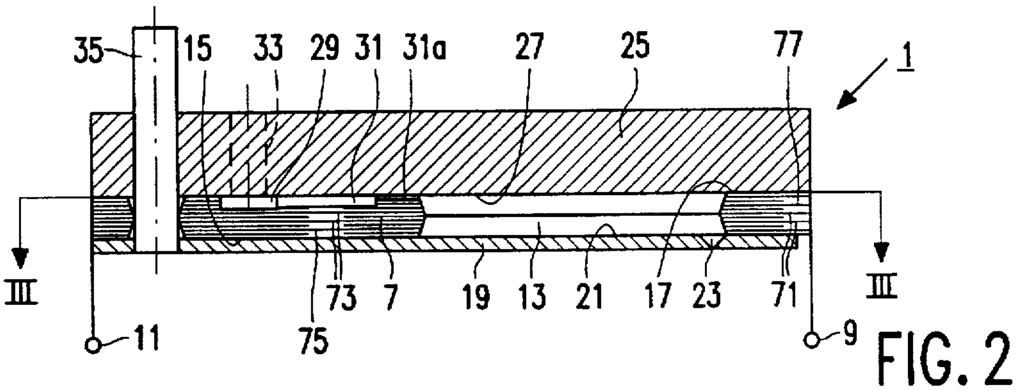
FIG. 2 is a cross-section of a first embodiment of an ink jet recording head for the device according to the invention.

A cross-section of a first embodiment of the recording head 1 is shown in FIG. 2. This recording head comprises a piezoelectric actuator element 7 in the form of a plate that consists of a plurality of layers of a ceramic piezoelectric material alternated with electrode layers. As shown schematically in FIG. 2, the first, third, fifth, etc. electrode layers 71 are connected to a first terminal 9 and the second, fourth, sixth, etc. electrode layers 73 are connected to a second terminal 11. The odd-numbered electrode layers 71 are interrupted in a first zone 75 so as to isolate them from the second terminal 11 and the even-numbered electrode layers 73 are interrupted in a second zone 77 so as to isolate them from the first terminal 9. Between the first and second zones 75, 77 an active part of the actuator plate 7 is situated. The terminals 9, 11 receive voltage pulses from the control unit 5 as will be discussed later. Actuator elements of this type are known in the art as ceramic multilayer actuators (CMA's). Other feasible types of actuator plates comprise a single layer of a piezoelectric material sandwiched between two electrode layers. When a voltage is applied between the terminals 9 and 11, the dimension of at least the active part of the actuator plate 7 in the vertical direction in FIG. 2 is varied. In other words, the actuator plate 7 changes its thickness upon application of a voltage. The direction in which the dimension of an actuator plate is changed upon application of a voltage is called its active direction. The active part of the actuator plate 7 is provided with a recess 13 that forms a pressure chamber. In the embodiment shown in FIG. 2, the recess 13 extends through the thickness of the actuator plate so as to connect a first face 15 of the actuator plate 7 to a second face 17 opposite the first face. The pressure chamber 13 can be formed in the actuator plate 7 by one of several well-known technologies. Among these technologies are sawing, ultrasonic drilling, wet chemical etching, powder-blasting and laser cutting. Another feasible technique is the so-called green sheet technology where the ceramic body is formed into the desired structure prior to sintering and acquires its final form during the sintering process.

A nozzle plate 19 has a first face 21 that adjoins to the first face 15 of the actuator plate 7 so as to form a first wall of the pressure chamber 13. The nozzle plate 19 has a plurality of nozzle openings 23 therein, one of which is visible in FIG. 2. This nozzle opening 23 extends between the pressure chamber 13 and the space surrounding the recording head. The nozzle plate 19 is preferably a thin metal plate in which the nozzle openings 23 have been formed for example by etching,spark erosion or laser cutting. It is also possible to form the nozzle plate 19 from a suitable plastics material, e.g. by injection moulding.

Figure 3:
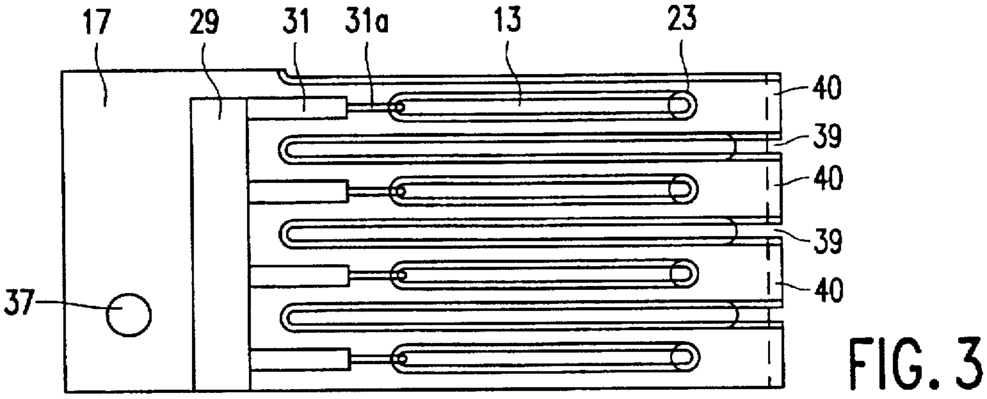
FIG. 3 is a section according to the line III—III of a part of the recording head shown in FIG. 2, FIGS. 4 to 8 are cross-sections of second, third, fourth, fifth and sixth embodiments respectively.

A base plate 25 has a first face 27 that adjoins the second face 17 of the actuator plate 7 so as to form a second wall of the pressure chamber 13. An ink reservoir 29 communicates with the pressure chamber 13 via an ink supply channel 31. The ink reservoir 29 and the ink supply channel 31 are formed as recesses in the second face 17 of the actuator plate 7, preferably together with the recess 13. As can be seen more clearly in FIG. 3, the ink reservoir 29 is a relatively wide duct interconnecting the ink supply channels 31. In order to prevent a pressure wave in one of the pressure chambers 13 from causing a rise of pressure in one or more of the other pressure chambers, each ink supply channel 31 comprises a restricted portion 31*a* that serves as a choke. The first face 27 of the base plate 25 covers the ink reservoir 29 and the ink supply channel 31. The base plate 25 comprises one or more filling channels 33 formed as through-holes (shown in dotted lines in FIG. 2) to connect the ink reservoir 29 to an ink storage vessel (not shown). The construction of the recording head 1 from the actuator plate 7, the nozzle plate 19 and the base plate 25 is very simple. The parts are aligned by means of an alignment pin 35 that extends through alignment holes 37 provided in all three components of the recording head.

After the recording head 1 has been completed, the ink reservoir 29, the ink supply channels 31 and the pressure chambers 13 are filled with a suitable ink. When a voltage of a predetermined polarity is applied between the electrodes 9 and 11, the thickness of the actuator plate 7 increases so that the volume of the pressure chamber 13 grows. As a result ink flows from the ink reservoir 29 through the ink supply channel 31 to the pressure chamber 13. When the voltage between the electrodes 9 and 12 is reduced to zero or when its polarity is reversed, the pressure chamber suddenly contracts so that a droplet of ink is expelled through the nozzle 23. The very small cross-section of the restricted portion 31*a* of the ink supply channel prevents the flow of ink from the pressure chamber 13 back to the ink reservoir 29 as a result of the contraction of the pressure chamber. This serves to reduce cross-talk between the nozzles 23 of a recording head 1 via the ink reservoir 29. Cross-talk via the actuator plate 7 is reduced by the provision of slits 39 between the pressure chambers 13, said slits extending through the active part of the actuator plate beyond the first zones 75. Due to these slits the actuator plate 7 is split into a plurality of fingers 40, each finger comprising one of the pressure chambers 13. The electrode layers 71, 73 in adjacent fingers 40 are electrically isolated by the slit 39 between these fingers and the fingers themselves are mechanically substantially isolated by the slits.

Figure 4:
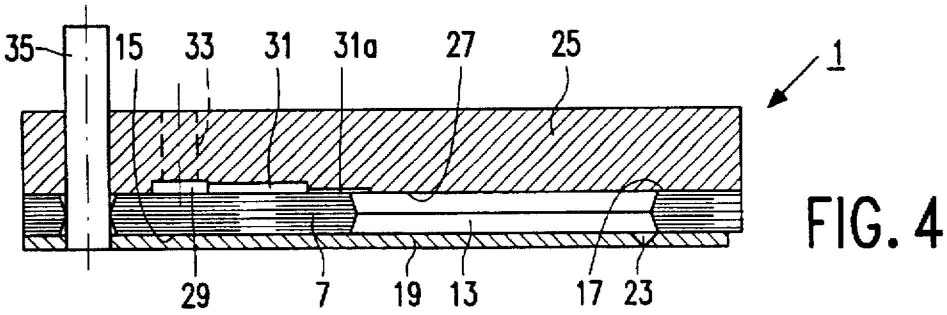

FIG. 4 shows a cross-section of a second embodiment of the ink jet recording head 1. In this embodiment, the ink reservoir 29 and the ink supply channel 31 are formed as recesses in the first face 27 of the base plate 25 instead of in face 17 of actuator plate 7.

Figure 5:
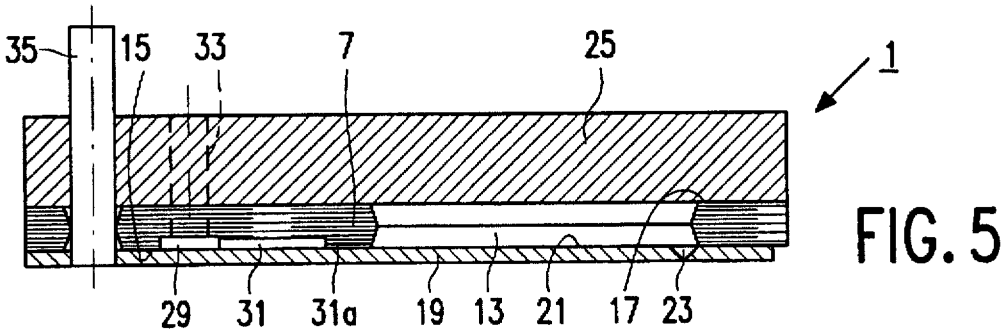

FIG. 5 shows a cross-section of a third embodiment in which the ink reservoir 29 and the ink supply channel 31 are formed as recesses in the first face 15 of the actuator plate 7. In this embodiment the filling channels 33 extend through the actuator plate 7 as well as through the base plate 25.

Figure 6:
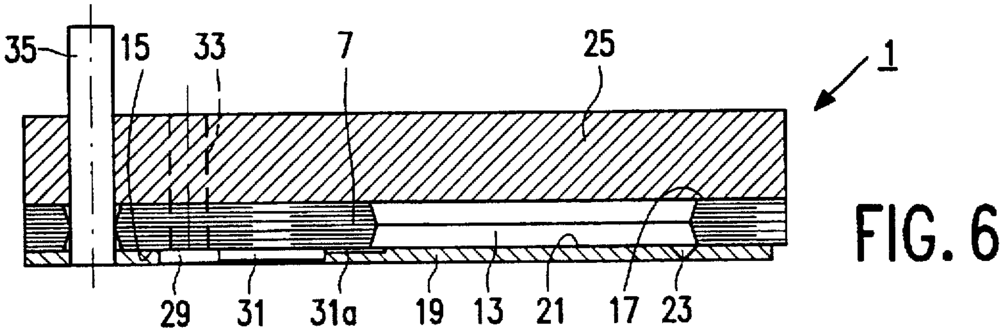

FIG. 6 shows a cross-section of a fourth embodiment in which the ink reservoir 29 and the ink supply channel 31 are formed as recesses in the first face 21 of the nozzle plate 19. The filling channels 33 extend through both the actuator plate 7 and the base plate 25 as in the third embodiment.

Figure 7:
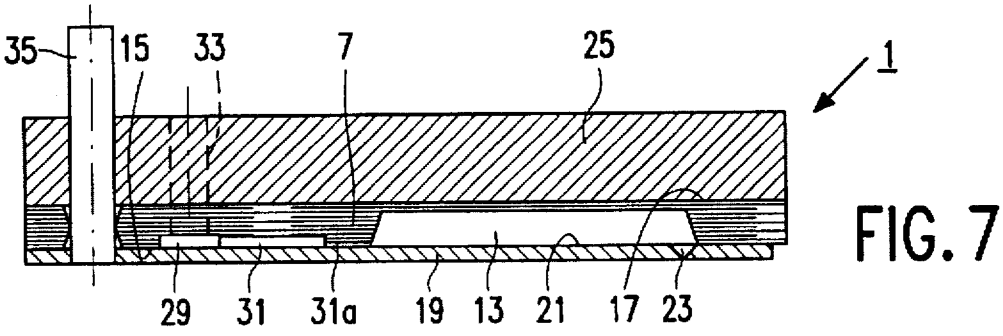
Figure 8:
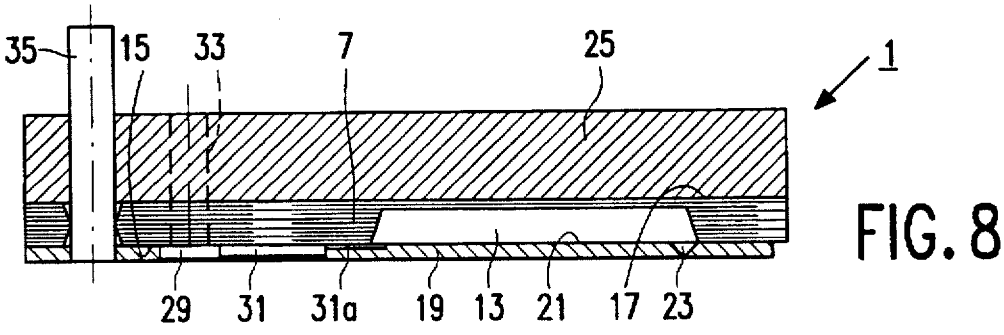

FIGS. 7 and 8 show cross-sections of a fifth and a sixth embodiment, respectively. In these embodiments the recess that forms the pressure chamber 13 is provided in the first face 15 of the actuator plate 7 without extending to the second face 17. The first face 21 of the nozzle plate 19 adjoins the first face 15 of the actuator plate 7 so as to form a first wall of the pressure chamber 13. The filling channels 33 extend through the base plate 25 and the actuator plate 7. It is to be noted that in these embodiments the base plate 25 does not form a wall of the pressure chamber 13. Therefore, it may be omitted if the actuator plate 7 is strong enough to form a self-supporting structure together with the nozzle plate 19. The difference between the fifth and sixth embodiments is that in the fifth embodiment the ink reservoir 29 and the ink supply channel 31 are formed as recesses in the first face 15 of the actuator plate 7 whereas in the sixth embodiment they are formed as recesses in the first face 21 of the nozzle plate 19.

Figure 9:
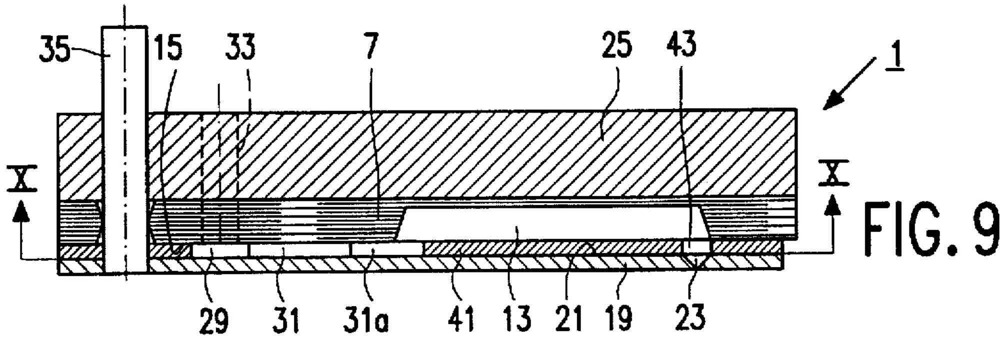
FIG. 9 is a cross-section of a seventh embodiment of an ink jet recording head for the device shown in FIG. 1.
Figure 10:
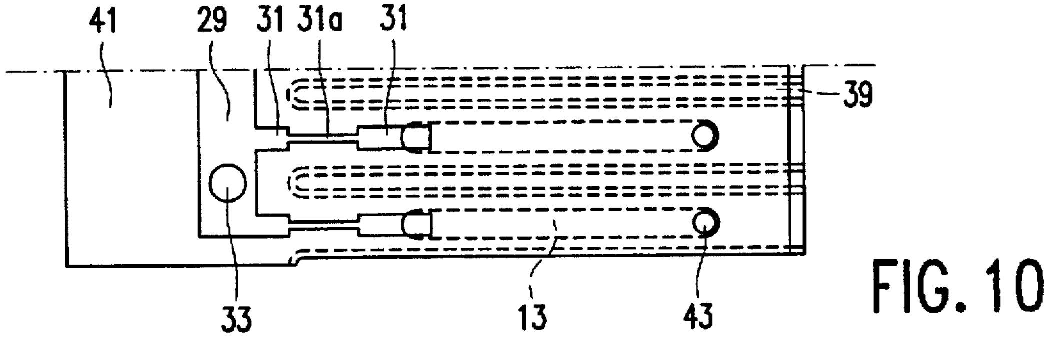
FIG. 10 is a section according to the line X—X of a part of the recording head shown in FIG. 9.

FIGS. 9 and 10 show a cross-section and a section according to the line X—X, respectively, of a seventh embodiment. In this embodiment an intermediate plate 41 is provided between the first face 15 of the actuator plate 7 and the nozzle plate 19. The ink reservoir 29 and the ink supply channel 31 are formed as apertures in the intermediate plate 41. The intermediate plate 41 may be a metal plate in which the apertures are formed for example by etching, laser cutting or a similar technique. The dimensions of the reservoir 29 and the ink supply channel 31 are defined by the thickness of the intermediate plate 41 so that they can be manufactured with a high precision at little extra cost. In this embodiment the restricted portion 31*a* of the ink supply channel 31 is provided about halfway that channel. Of course it could also be provided adjacent the pressure chamber 13 as in the embodiments discussed above. A further aperture 43 in the intermediate plate 41 is provided opposite the nozzle 23 and connects the pressure chamber 13 with the nozzle.

Figure 11:
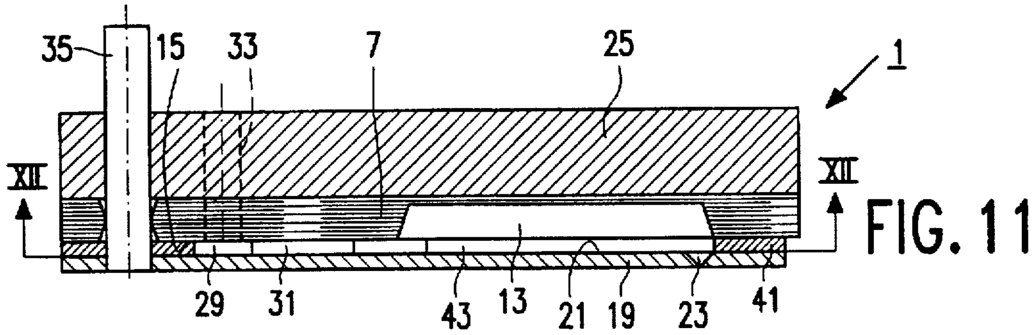
FIG. 11 is a cross-section of an eighth embodiment of an ink jet recording head for the device shown in FIG. 1.
Figure 12:
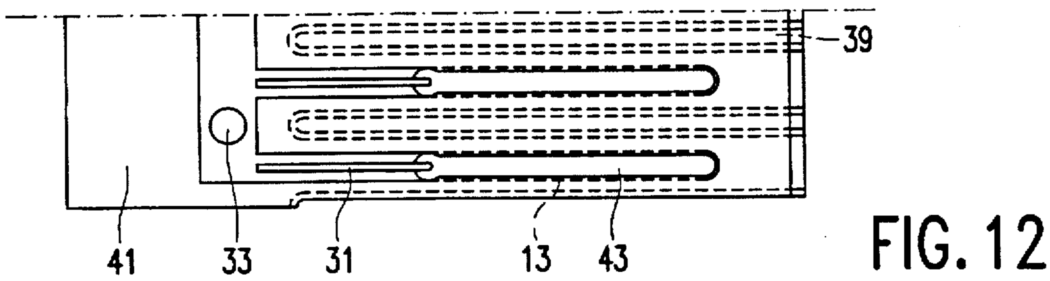
FIG. 12 is a section according to the line XII—XII of a part of the recording head shown in FIG. 11, FIGS. 13, 14 and 15 are cross-sections of ninth, tenth and eleventh embodiments respectively.

FIGS. 11 and 12 show an eighth embodiment that, like the seventh embodiment, comprises an intermediate plate 41, the ink reservoir 29 and the ink supply channel 31 being formed as apertures in the intermediate plate. In this embodiment the shape and area of the further aperture 43 substantially correspond to the shape and area of the recess in the actuator plate 7 that forms the pressure chamber 13. This can be seen clearly in the view shown in FIG. 12. This makes the precision of the alignment of the intermediate plate 41 relative to the actuator plate 7 and the nozzle plate 19 less critical. A further difference that can be seen clearly in FIG. 12 is that the ink supply channel 31 has a very small width over its whole length so that there is no need for a restricted portion 31*a*.

Figure 13:
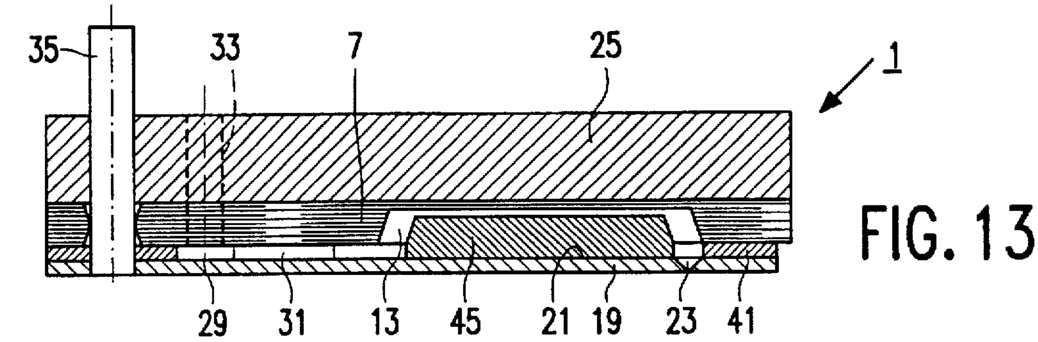
Figure 14:
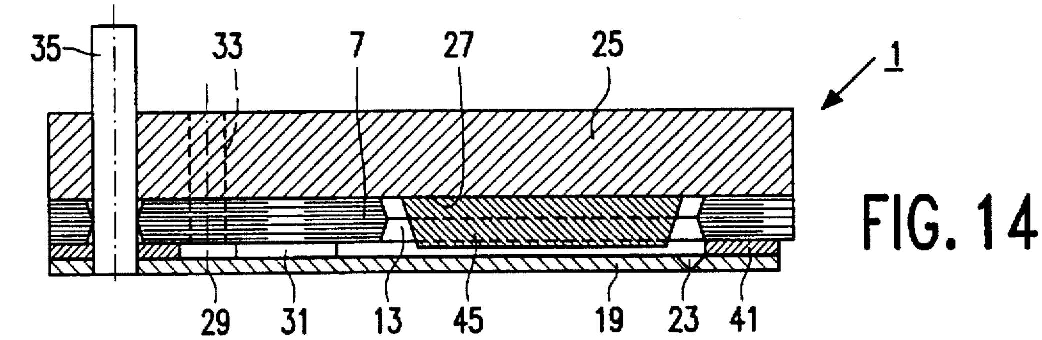

FIGS. 13 and 14 show a cross-section of a ninth and an tenth embodiment, respectively, in which a substantial part of the volume of the pressure chamber 13 is filled with a filler 45. In the ninth embodiment the filler 45 is formed as a protrusion on the first face 21 of the nozzle plate 19, and in the tenth embodiment the filler is formed as a protrusion on the first face 27 of the base plate 25. The filler 45 may comprise a flexible material such as rubber. The filler 45 substantially improves the efficiency of the recording head by lowering the total volume V of the pressure chamber 13 without lowering the displaced volume $\Delta V$ that results from the action of the actuator element 7. Consequently, the relative displaced volume $\Delta V/V$ is increased and the energy required for the expulsion of a droplet of ink is reduced.

Figure 15:
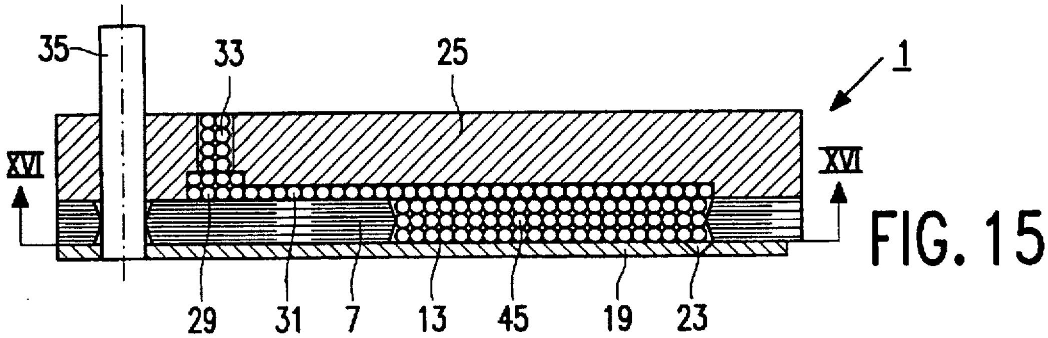
Figure 16:
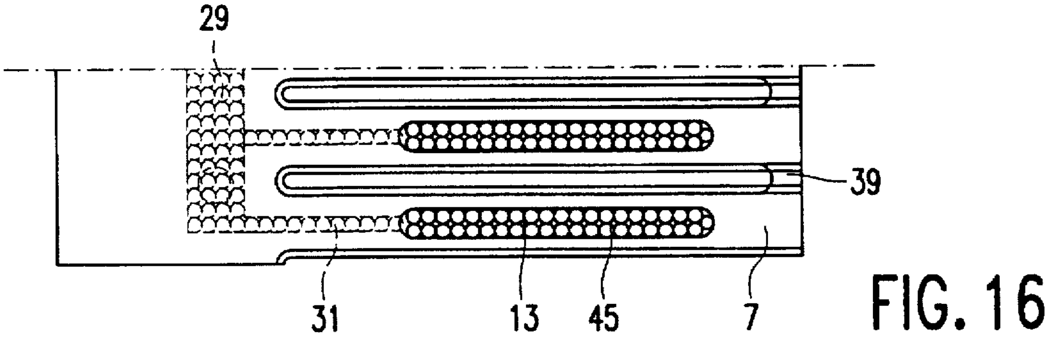
FIG. 16 is a section according to the line XVI—XVI of a part of the recording head shown in FIG. 15.

FIGS. 15 and 16 show a twelfth embodiment in which a further type of filler 45 is applied. In this embodiment the filler 45 consists of a porous material, for example small glass balls. This material may also be provided in the ink supply channel 31, the ink reservoir 29 and the filling channel 33. The properties and the quantity of the porous material must be chosen such that the movement of the actuator element 7 is not impeded. If glass balls are used, this means that the packing must not be so tight that the material behaves as a solid mass. There must be room for free relative movement of the balls. A further example of a suitable porous material is rockwool.

Figure 17:
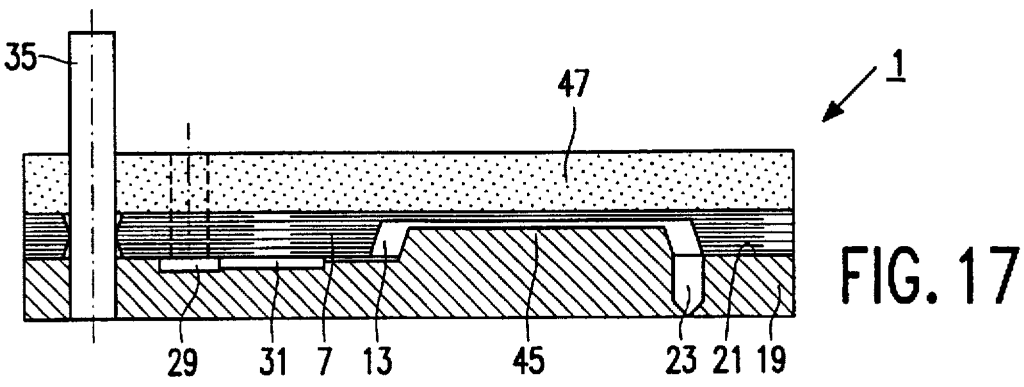
FIG. 17 is a cross-section of a twelfth embodiment.

FIG. 17 shows a cross-section of a twelfth embodiment in which the nozzle plate 19 has a thickness that substantially exceeds the thickness of the nozzle plate 7 in the previously discussed embodiments. The filler 45 is formed as a protrusion on the first face 21 of the nozzle plate 19 but, unlike the embodiment shown in FIG. 13, it is made of the same material as the nozzle plate. The filler 45 and the nozzle plate 19 are a unitary structure which greatly simplifies the construction of the recording head 1. A nozzle plate of this type may be made from a suitable plastics material. It can be manufactured very simply by injection moulding. A further advantage of the increased thickness of the nozzle plate 19 is that the nozzle plate is now sufficiently strong to support the complete construction. As a consequence, it is not necessary to provide a base plate 25 as a supporting element. In the embodiment shown in FIG. 17 the base plate is replaced by a flexible plate 47 which may be made of rubber or a similar material.

Figure 18:
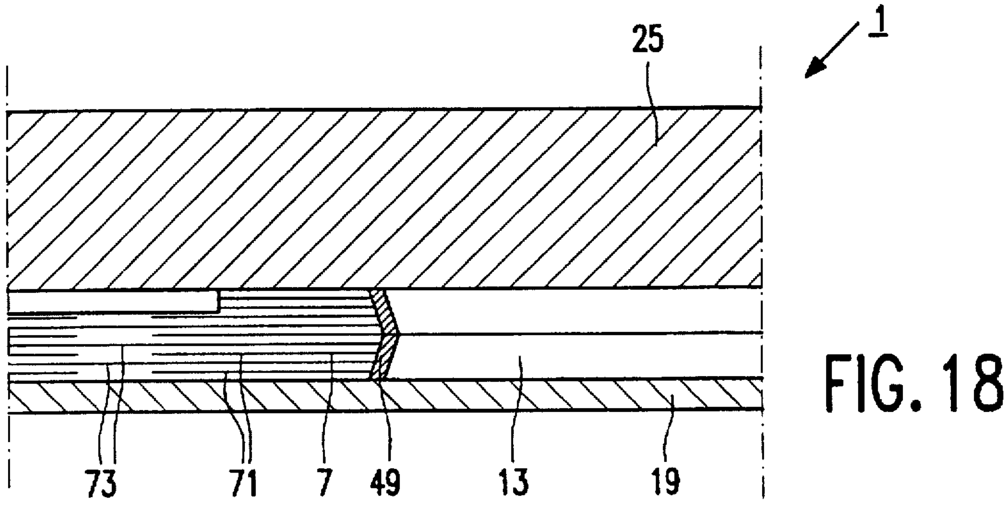
FIG. 18 is a cross-section on an enlarged scale of a modified form of an ink jet recording head for the device shown in FIG. 1.

FIG. 18 shows a cross-section of a part of a modified recording head 1 on en enlarged scale. As explained in relation to FIG. 2, the actuator plate 7 consists of layers of a piezoelectric ceramic material alternated with electrode layers, the odd-numbered electrode layers being connected to the first electrode 9 and the even-numbered electrode layers being connected to the second electrode 11. As can be seen in the cross-sections, the electrode layers are interrupted by the recess that forms the pressure chamber 13 and, consequently, their edges form part of the side walls of this pressure chamber (to the left and right in the cross-sections). As a result of this, the electrode layers are exposed to the interior of the pressure chamber 13 and to the ink that is present in the pressure chamber during operation of the ink jet recording device. This ink may be electrically conductive, for example if a water-based ink is used. FIG. 18 shows the positions of the odd-numbered electrode layers 71 and the even-numbered electrode layers 73 near the left-hand wall of the pressure chamber 13. Because the odd-numbered electrode layers 71 are connected to the first terminal 9 and the even-numbered electrode layers 73 to the second terminal 11 and because in operation a voltage is applied between the first and second terminals, electrochemical processes may take place in the system comprising the electrode layers and the ink. Such processes could easily damage the electrode layers. To prevent this damage, a coating 49 of an electrically insulating material may be provided on the interior walls of the recess that forms the pressure chamber 13. This coating should cover at least those parts of these walls in which electrode layers 71,73 are exposed to the interior of the pressure chamber 13. Suitable coatings are organic coatings which may be applied e.g. by spraying, dipping, CVD-technology or anorganic coatings (for example glass or ceramic applied by means of CVD-technology). A preferred organic material is a parylen coating applied via CVD processes. Common anorganic materials are $SiO_2$, $Si_3N_4/SiO_2$, $Pb(Zr_{1-x}Ti_x)O_3$, $Al_2O_3$.

Figure 19:
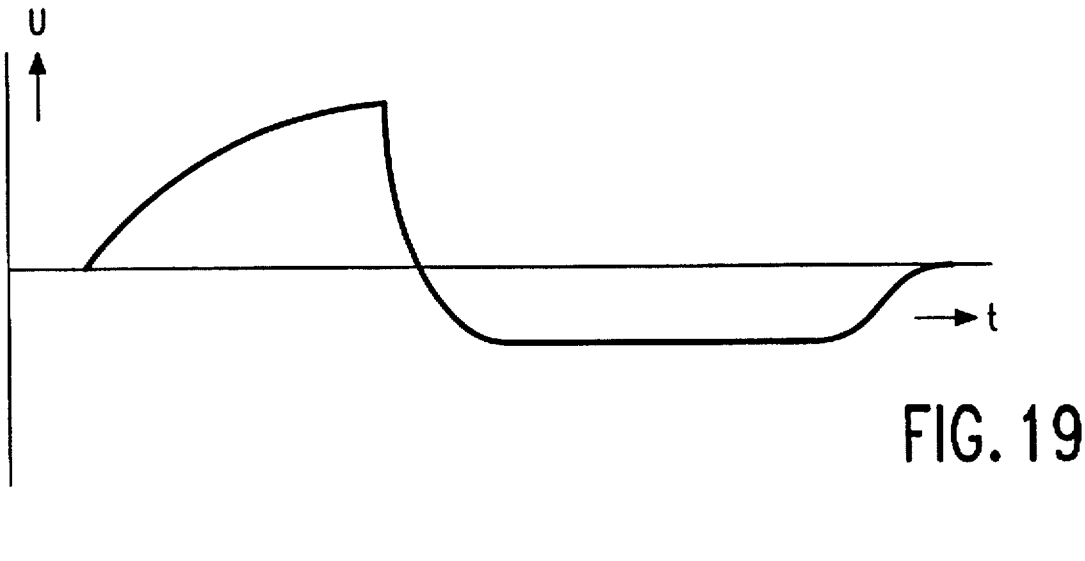
FIG. 19 is a diagram showing a preferred shape of a voltage pulse applied to the electrodes of the ink jet recording head for the device shown in FIG. 1.

Another method to prevent electrochemical processes between the electrode layers and the ink is choosing an appropriate voltage signal U(t) to be applied to the terminals 9 and 11. The application of such a signal is discussed in the copending patent application Ser. No. 08/556,693, filed Nov. 13, 1995, assigned to the present assignee (PHN 15.080). It is a feature of such a signal that it does not lead to a DC-contribution to the current, i.e. $\int I(t)dt=0$. This condition can be satisfied if a voltage U is applied that substantially satisfies the related condition $\int U(t)dt=0$. An example of such a voltage U as a function of time t is shown in FIG. 19.

We claim:

1. An ink jet recording device having a recording head which comprises:
   - a pressure chamber which is coupled to an ink reservoir by an ink supply channel;
   - a nozzle plate having a nozzle opening for emitting droplets of ink, said nozzle plate forming a wall of said pressure chamber;
   - a piezoelectric actuator element having an active direction and comprising at least one layer of piezoelectric material interleaved between electrode layers arranged such that a dimension of the actuator element in the active direction is varied upon application of an electric voltage between terminals which are electrically connected to the electrode layers, the actuator element being arranged in relation to the pressure chamber so the volume of the pressure chamber changes when the dimension of the actuator element in the active direction is varied; and
   - a base plate:
   - wherein, the piezoelectric actuator element is formed as an actuator plate having a first face and a second opposite face parallel to said first face, said piezoelectric actuator element further having a thickness in a direction perpendicular to said first face and said second face, said active direction coincides with the thickness direction thereof, said base plate adjoins to said second face of said actuator plate, said pressure chamber is formed by a recess provided in at least one of the first face and the second face of said actuator plate, and said ink reservoir and said ink channel are formed by recesses provided in said base plate, said nozzle plate, or said actuator plate.

2. An ink jet recording device as claimed in claim 1, wherein the recess forming said pressure chamber extends entirely through the thickness of the actuator plate between the first face and the second opposite face thereof, the nozzle plate has a face that adjoins the first face of the actuator plate so as to thereby form said wall of the pressure chamber, and said base plate has a face which adjoins the second face of the actuator plate so as to form another wall of the pressure chamber.

3. An ink jet recording device as claimed in claim 2, wherein said recesses forming the ink reservoir and the ink supply channel are in either the first face or the second face of the actuator plate.

4. An ink jet recording device as claimed in claim 2, wherein said recesses forming the ink reservoir and the ink supply channel are in either the face of the nozzle plate or the face of the base plate.

5. An ink jet recording device as claimed in claim 1, wherein the recess forming pressure chamber is in the first face of the actuator plate without extending to the second face thereof opposite the first face, the nozzle plate having a face that adjoins the first face of the actuator plate so as to form said first wall of the pressure chamber.

6. An ink jet recording device as claimed in claim 5, wherein said recesses forming the ink reservoir and the ink supply channel are in either the face of the nozzle plate or the first face of the actuator plate.

7. An ink jet recording device as claimed in claim 1 wherein a coating of an electrically insulating material is provided on interior walls of the recess in the actuator plate that forms the pressure chamber, said coating covering at least parts of the walls where said electrode layers are present within the pressure chamber.

8. An ink jet recording device as claimed in claim 1 wherein a substantial part of the volume of the pressure chamber is filled with a filler.

9. An ink jet recording device as claimed in claim 8, wherein the filler is in the form of a protrusion on the face of either the nozzle plate or the base plate.

10. An ink jet recording device as claimed in claim 8, wherein the filler comprises a porous material.

11. An ink jet recording device as claimed in claim 9, wherein the filler comprises a flexible material.

12. An ink jet recording device having a recording head which comprises:

a pressure chamber which is coupled to an ink reservoir by an ink supply channel;

a nozzle plate having a nozzle opening for emitting droplets of ink, said nozzle plate forming at least a part of a wall of said pressure chamber;

an intermediate plate provided between said pressure chamber and said nozzle plate; and a piezoelectric actuator element having an active direction and comprising at least one layer of piezoelectric material interleaved between electrode layers arranged such that a dimension of the actuator element in the active direction is varied upon application of an electric voltage between terminals which are electrically connected to the electrode layers, the actuator element being arranged in relation to the pressure chamber so the volume of the pressure chamber changes when the dimension of the actuator element in the active direction is varied;

wherein, the piezoelectric actuator element is in the form of an actuator plate having first and second opposite parallel faces and a thickness in a direction perpendicular to said faces, said active direction coincides with the thickness direction thereof, said pressure chamber is formed by a recess provided in at least one of the faces of said actuator plate, said ink reservoir and said ink supply channel being formed as apertures in the intermediate plate.

* * * * *